(12) United States Patent  
Jiang et al.

(10) Patent No.: US 8,570,043 B2
(45) Date of Patent: Oct. 29, 2013

(54) SYSTEM AND METHOD FOR SELF-SEALING A COLDHEAD SLEEVE OF A MAGNETIC RESONANCE IMAGING SYSTEM

(75) Inventors: Longzhi Jiang, Florence, SC (US); Evangelos Trifon Laskaris, Schenectady, NY (US); John Scaturro, Jr., Florence, SC (US); William Einziger, Florence, SC (US); John Arthur Urbahn, Saratoga Springs, NY (US); Kathleen Melanie Amm, Clifton Park, NY (US); Jalal Zia, Florence, SC (US); In-Hua Xu, Florence, SC (US)

(73) Assignee: General Electric Company, Schenectady, NY (US)

( * ) Notice: Subject to any disclaimer, the term of this patent is extended or adjusted under 35 U.S.C. 154(b) by 447 days.

(21) Appl. No.: 12/898,278

(22) Filed: Oct. 5, 2010

(65) Prior Publication Data

US 2012/0081117 A1   Apr. 5, 2012

(51) Int. Cl.
*G01V 3/00* (2006.01)

(52) U.S. Cl.
USPC ............................................ 324/319; 62/51.1

(58) Field of Classification Search
USPC ............................ 324/319, 318, 322; 62/51.1
See application file for complete search history.

(56) References Cited

U.S. PATENT DOCUMENTS

| | | | |
|---|---|---|---|
| 5,304,934 A | 4/1994 | Laskaris et al. | |
| 5,333,464 A | 8/1994 | Laskaris et al. | |
| 5,430,423 A | 7/1995 | Herd et al. | |
| 5,701,744 A | 12/1997 | Eckels et al. | |
| 6,029,458 A | 2/2000 | Eckels | |
| 6,807,812 B2 | 10/2004 | Lehmann et al. | |
| 7,503,181 B2 * | 3/2009 | Mraz et al. | 62/51.1 |
| 7,728,592 B2 | 6/2010 | Ma et al. | |
| 7,772,842 B2 | 8/2010 | Gao et al. | |
| 2005/0166600 A1 | 8/2005 | Mitsubori | |
| 2007/0089432 A1 * | 4/2007 | Boesel et al. | 62/51.1 |
| 2008/0242974 A1 | 10/2008 | Urbahn et al. | |

FOREIGN PATENT DOCUMENTS

JP    8261821 A    10/1996

OTHER PUBLICATIONS

Search Report from corresponding GB Application No. 1116446.4, Jan. 24, 2012.

* cited by examiner

*Primary Examiner* — Louis Arana
(74) *Attorney, Agent, or Firm* — The Small Patent Law Group; Dean D. Small

(57) ABSTRACT

Systems and methods for self-sealing a coldhead sleeve of a magnetic resonance imaging system are provided. One coldhead sleeve arrangement includes a coldhead sleeve configured to receive therein a coldhead of an MRI system and having an open end. The coldhead sleeve arrangement also includes a sealing member coupled at the open end of the coldhead sleeve and configured in a normally closed position covering the open end.

20 Claims, 7 Drawing Sheets

SYSTEM AND METHOD FOR SELF-SEALING A COLDHEAD SLEEVE OF A MAGNETIC RESONANCE IMAGING SYSTEM

BACKGROUND OF THE INVENTION

The subject matter disclosed herein relates generally to cryogenically cooled magnetic resonance imaging (MRI) systems, and more particularly to systems and methods for sealing a coldhead sleeve of the MRI systems.

In superconducting coil MRI systems, the coils forming the superconducting magnets are cryogenically cooled using a helium vessel. The cryogen cooling system of some of these MRI systems include a coldhead within a coldhead sleeve that operates to recondense vaporized cryogen to continually cool the superconducting magnet coils during system operation.

In conventional MRI systems, the coldhead sleeve is designed having an open end to a magnet cartridge, which is within a vacuum enclosure such that the open end is exposed to a helium vessel under pressure. When servicing or replacing the coldhead, service personnel remove the coldhead from the coldhead sleeve, thereby exposing the helium vessel to the atmosphere. When the MRI system is operating at high pressure, venting is needed to reduce the pressure. Thus, service personnel are exposed to high pressure and also the flush loss of helium from within the MRI system. Safety concerns exist particularly if the magnet in the MRI system quenches during coldhead servicing or replacement, resulting in boil off of helium.

Accordingly, the servicing of the coldhead in conventional MRI systems can be unsafe due to the high pressure environment. Additionally, helium from the helium vessel is lost and must be replaced, which results in added cost and further system maintenance.

BRIEF DESCRIPTION OF THE INVENTION

In accordance with various embodiments, a coldhead sleeve arrangement for a coldhead of a magnetic resonance imaging (MRI) system is provided. The coldhead sleeve arrangement includes a coldhead sleeve configured to receive therein a coldhead of an MRI system and having an open end. The coldhead sleeve arrangement also includes a sealing member coupled at the open end of the coldhead sleeve and configured in a normally closed position covering the open end.

In accordance with other embodiments, a magnetic resonance imaging (MRI) magnet system is provided that includes a vessel having liquid helium therein, a superconducting magnet within the vessel, a coldhead and a coldhead sleeve receiving therein the coldhead and having an open end. The MRI magnet system also includes a movable sealing member coupled at the open end of the coldhead sleeve and biased in a normally closed position covering the open end.

In accordance with yet other embodiments, a method for forming a self-sealing coldhead sleeve for a magnetic resonance imaging (MRI) magnet system is provided. The method includes configuring a sealing member in a normally closed arrangement and coupling the sealing member to the coldhead sleeve at an open end of the coldhead sleeve such that the sealing member is biased in a normally closed position when a coldhead is removed from the coldhead sleeve.

DETAILED DESCRIPTION OF THE INVENTION

Figure 1:
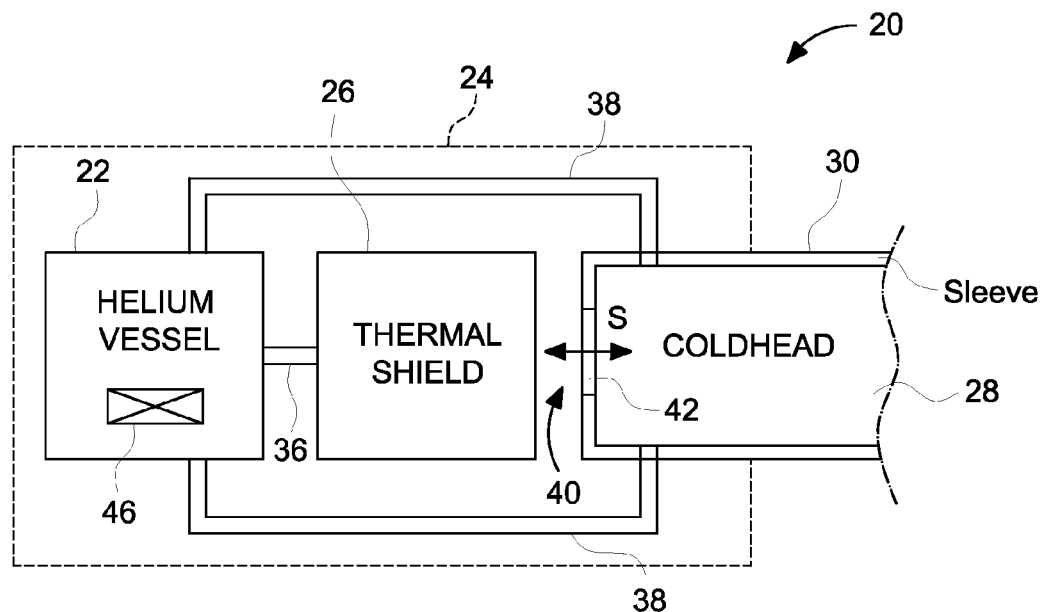
FIG. 1 is a simplified block diagram of magnetic resonance imaging (MRI) magnet system illustrating a self-sealing coldhead sleeve formed in accordance with various embodiments embodiment.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for sealing a coldhead sleeve of a magnetic resonance imaging (MRI) system when the coldhead is removed from the coldhead sleeve, such as during maintenance, servicing and/or replacement. The various embodiments include a sealing mechanism that automatically seals an open end of the coldhead sleeve when the coldhead is removed from the coldhead sleeve. By practicing at least one embodiment, the amount of flushed helium into the atmosphere is reduced and the exposure to the high pressure of the helium vessel of the MRI system is also reduced.

Figure 2:
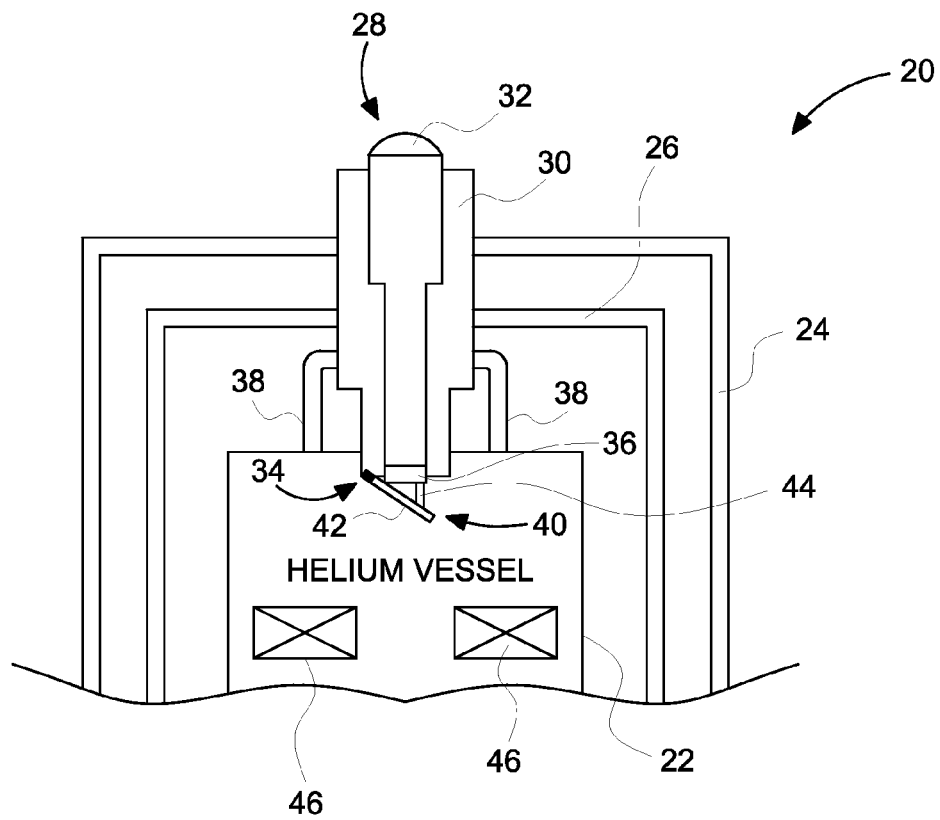
FIG. 2 is a diagram illustrating a self-sealing arrangement for a coldhead sleeve formed in accordance with various embodiments.

FIGS. 1 and 2 illustrate embodiments wherein a coldhead sleeve is self-sealing. Specifically, FIGS. 1 and 2 are simplified block diagrams illustrating an MRI magnet system 20, which includes one or more superconducting magnets. It should be noted that like numerals represent like parts throughout the Figures. The MRI magnet system 20 includes a vessel 22 that holds a liquid cryogen, such as liquid helium. Thus, in this embodiment, the vessel 22 is a helium vessel, which also may be referred to as a helium pressure vessel. The vessel 22 is surrounded by a vacuum vessel 24 and includes a thermal shield 26 therein and/or therebetween. The thermal shield 26 may be, for example, a thermally isolating radiation shield. A coldhead 28, which in various embodiments is a cryocooler, extends through the vacuum vessel 24 within a coldhead sleeve 30 (e.g., a housing). Thus, the cold end of the coldhead 28 may be positioned within the coldhead sleeve 30 without affecting the vacuum within the vacuum vessel 24. The coldhead 28 is inserted (or received) and secured within the coldhead sleeve 30 using any suitable means, such as one or more flanges and bolts, or other means known in the art. Moreover, a motor 32 of the coldhead 28 is provided outside the vacuum vessel 24.

The coldhead sleeve 30 includes an open end 34 into the helium vessel 22. As illustrated in FIG. 2, the coldhead 28 in various embodiments includes a recondenser 36 at a lower end of the coldhead 28 having a portion thereof that extends into the helium vessel 22 through the open end 34 when the coldhead 28 is inserted and received within the coldhead sleeve 30. The recondenser 36 recondenses boiled off helium gas from the helium vessel 22. The recondenser 36 is also coupled to the helium vessel 22 via one or more passageways 38. For example, the passageways 38 may be provided from the helium vessel 22 to the recondenser 36 for transferring boiled off helium gas from the helium vessel 22 to the recondenser 36, which then may transfer back recondensed helium liquid to the helium vessel 22 at the open end 34.

The coldhead sleeve 30 includes a self-sealing arrangement 40 at the open end 34 that automatically closes and/or seals the open end 34 when the coldhead 28 is removed from the coldhead sleeve 30. Accordingly, the helium vessel 22 is not open to the environment when the coldhead 28 is removed. The self-sealing arrangement 40 generally includes a sealing member 42 (e.g., a hatch or flapper) that engages a lower end of the coldhead sleeve 30 to automatically close and seal the opening when the coldhead 28 is removed. The self-sealing arrangement 40 may be coupled to or form part of the coldhead sleeve 30. The self-sealing arrangement 40 in various embodiments includes a biasing member (e.g., spring) that biases the sealing member 42 into a closed position (or state) to seal the open end 34. Thus, the sealing member 42 is a normally closed device that is moved to an open position (or state) when the coldhead 28 is inserted within the coldhead sleeve 30. For example, an actuating member 44, which may be a protrusion, tab, post or pin, may be provided as part of or coupled to the coldhead 28, such as on a bottom end of the recondenser 36, or as part of the sealing member 42. The actuating member 44 is operable to open the sealing member 42 when the coldhead 28 is inserted within the coldhead sleeve 30. The actuating member 44 optionally may form part or be coupled to the sealing member 42.

In operation, and as illustrated by the arrow S in FIG. 1, the self-sealing arrangement 40 includes the sealing member 42 that is operable between an open position when the coldhead 28 is inserted within the coldhead sleeve 30 and a closed (or sealed) position when the coldhead 28 is removed from the coldhead sleeve 30. In the open position, the coldhead 28 is in fluid communication with the helium vessel 22. In the closed position, the helium vessel 22 is sealed from the atmosphere such that the open end 34 is covered by the sealing member 42. In some embodiments, the sealing member 42 may be inserted within the open end 34 to seal the open end 34.

A magnet 46, which in various embodiments is a superconducting magnet, is provided inside the helium vessel 22 and is controlled during operation of the MRI system as described in more detail herein to acquire MRI image data. Additionally, during operation of the MRI system, liquid helium within the helium vessel 22 of the MRI magnet system 20 cools the superconducting magnet 46, which may be configured as a coil assembly as is known. The superconducting magnet 46 may be cooled, for example, to a superconducting temperature, such as 4.2 Kelvin (K). The cooling process may include the recondensing of boiled off helium gas to liquid by the recondenser 36 and returned to the helium vessel 22. It should be noted that the boiled off helium may also pass through one or more optional gas passageways (not shown) that connect the helium vessel 22 to the thermal shield 26.

In various embodiments, the self-sealing arrangement 40 generally includes a moving or movable sealing member 42 that is operable between the open and closed positions. The configuration of the sealing member 42 and the mechanism for moving and/or biasing the sealing member 42 may be any suitable configuration that moves the sealing member 42 between the open and closed positions.

Figure 3:
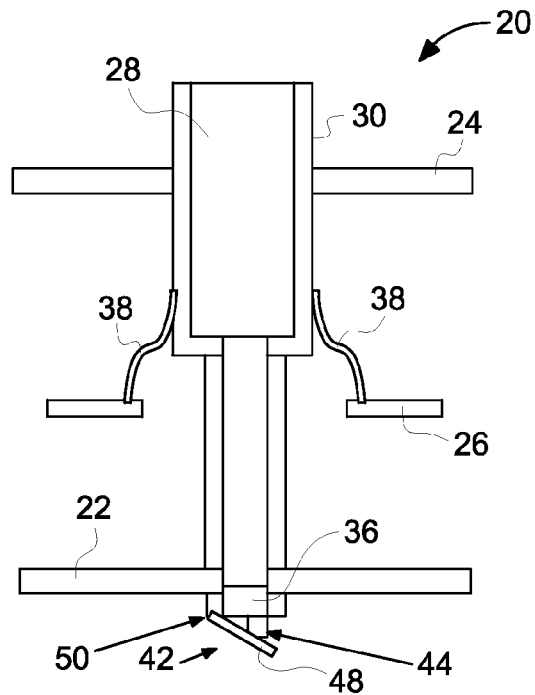
FIG. 3 is a cross-sectional view illustrating a self-sealing coldhead sleeve formed in accordance with an embodiment in an open position.
Figure 4:
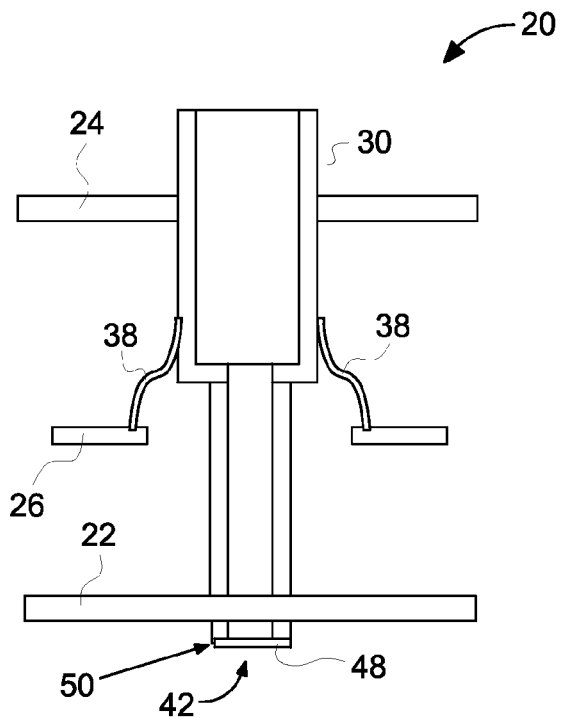
FIG. 4 is a cross-sectional view of the self-sealing coldhead sleeve of FIG. 3 in a closed position.

In one embodiment, illustrated in FIGS. 3 and 4, the self-sealing arrangement 40 is a spring actuated arrangement. FIG. 3 illustrates the open position with the coldhead 28 inserted within the coldhead sleeve 30 and FIG. 4 illustrates the closed position with the coldhead 28 removed from the coldhead sleeve 30. In this embodiment, the sealing member 42 is a hatch 48 configured as a pivoting flap. In particular, the hatch 48 is connected at one end via a spring joint 50 (or other biasing member) to the coldhead sleeve 30 such that the hatch 48 pivots between the open and closed positions. The self-sealing arrangement 40 also includes the actuating member 44, which in this embodiment is a protrusion, post, pin, etc., extending from the bottom of the coldhead 28, in particular, the bottom of the recondenser 36. Thus, the actuating member 44 is configured as an engagement member that engages the hatch 48 to open the hatch 48 as the coldhead 28 is inserted within the coldhead sleeve 30. Accordingly, the hatch 48 is moved to the open position as the coldhead 28 is inserted within the coldhead sleeve 30.

In the open position, the open end 34 is open to the helium vessel 22 such that hatch 48 is open to allow helium to flow/pass or drain into the helium vessel 22 from the recondenser 36. When the hatch 48 is biased closed, the hatch 48 engages the lower end of the coldhead sleeve 30 to automatically close and/or seal the coldhead sleeve 30 when the coldhead 28 is removed.

Figure 5:
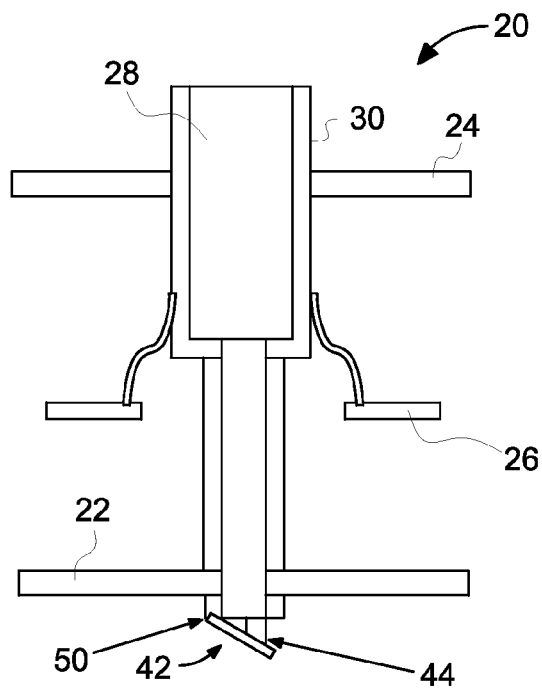
FIG. 5 is a cross-sectional view illustrating a self-sealing coldhead sleeve formed in accordance with another embodiment in an open position.
Figure 6:
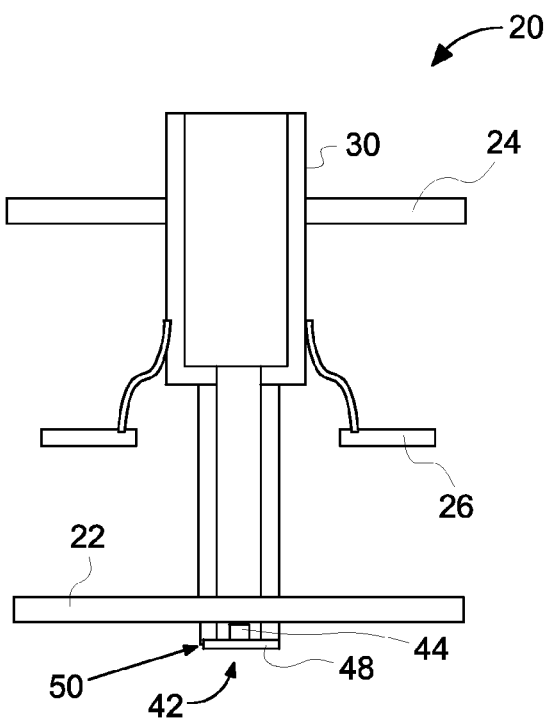
FIG. 6 is a cross-sectional view of the self-sealing coldhead sleeve of FIG. 5 in a closed position.

Modifications and variations are contemplated. For example, as illustrated in FIGS. 5 and 6, showing open and closed positions, respectively, the actuating member 44 is provided as part of the hatch 48. Accordingly, in operation, the actuating member 44 is configured as an engagement member that engages the bottom of the coldhead 28 as the coldhead 28 is inserted within the coldhead sleeve 30 to open the hatch 48.

Figure 7:
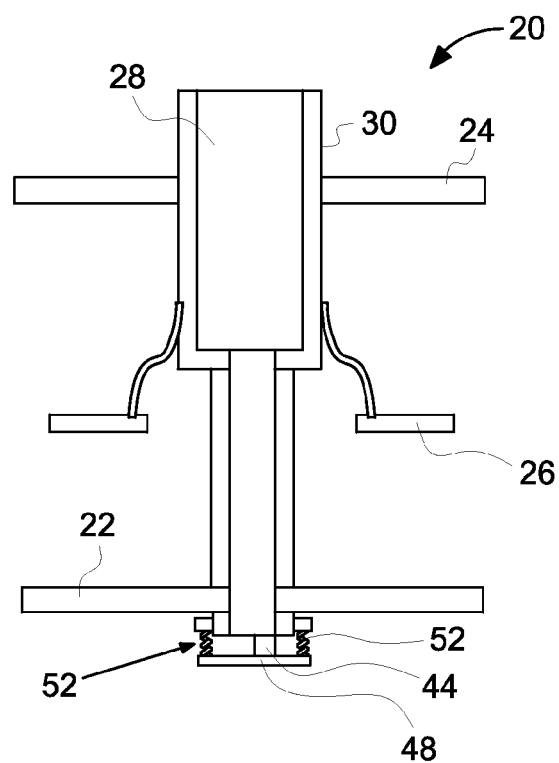
FIG. 7 is a cross-sectional view illustrating a self-sealing coldhead sleeve formed in accordance with another embodiment in an open position.
Figure 8:
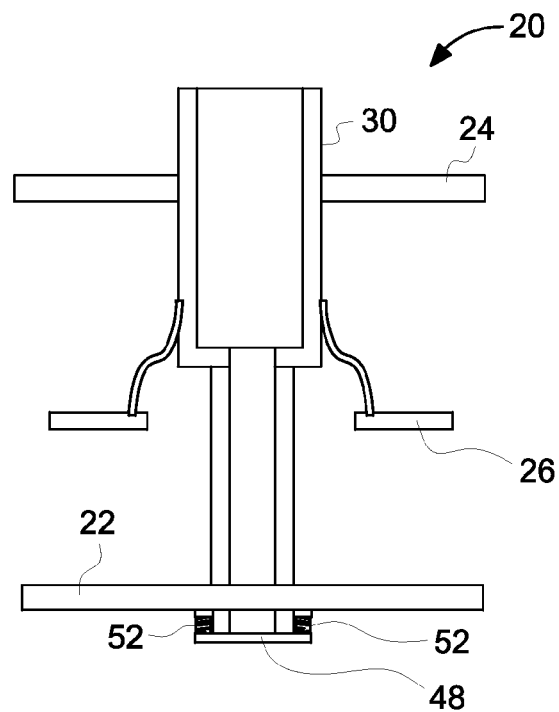
FIG. 8 is a cross-sectional view of the self-sealing coldhead sleeve of FIG. 7 in a closed position.

In another embodiment, illustrated in FIGS. 7 and 8, the self-sealing arrangement 40 is another spring actuated arrangement. FIG. 7 illustrates the open position with the coldhead 28 inserted within the coldhead sleeve 30 and FIG. 8 illustrates the closed position with the coldhead 28 removed from the coldhead sleeve 30. In this embodiment, the sealing member 42 is also the hatch 48 and configured as a moving plate, which in some embodiments is a linear movement toward and away from the open end 34. In particular, the hatch 48 is connected at each end via springs 52 (or other biasing members) to the coldhead sleeve 30 such that the hatch 48 moves away from and towards the open end 34 between the open and closed positions, respectively. The self-sealing arrangement 40 also includes the actuating member 44, which in this embodiment is a protrusion, post, pin, etc., extending from the bottom of the coldhead 28, in particular, the bottom of the recondenser 36. Thus, the actuating member 44 is configured as an engagement member that engages the hatch 48 to open the hatch 48 as the coldhead 28 is inserted within the coldhead sleeve 30. Accordingly, the hatch 48 is moved away from the open end 34 to the open position as the coldhead 28 is inserted within the coldhead sleeve 30.

In the open position, the open end 34 is open to the helium vessel 22 such that hatch 48 is open to allow helium to flow/pass or drain into the helium vessel 22 from the recondenser 36. When the hatch 48 is biased closed and moved in contact with the lower end of the coldhead sleeve 30, the hatch 48 engages the lower end of the coldhead sleeve 30 to automatically close and/or seal the coldhead sleeve 30 when the coldhead 28 is removed.

Figure 9:
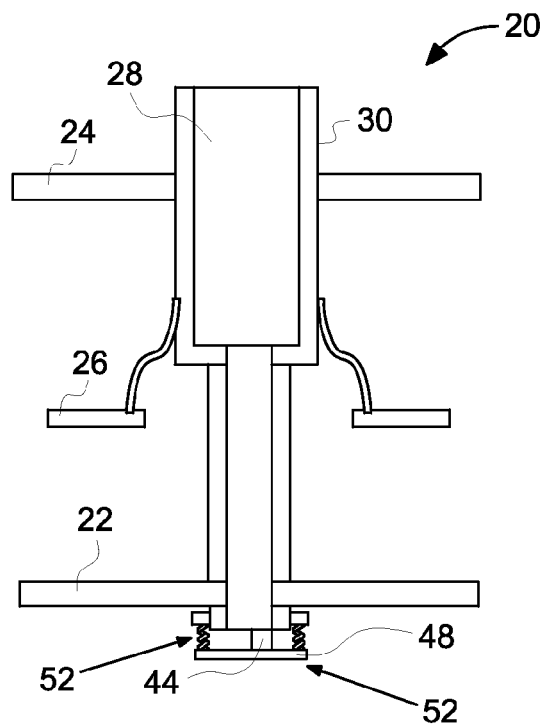
FIG. 9 is a cross-sectional view illustrating a self-sealing coldhead sleeve formed in accordance with another embodiment in an open position.
Figure 10:
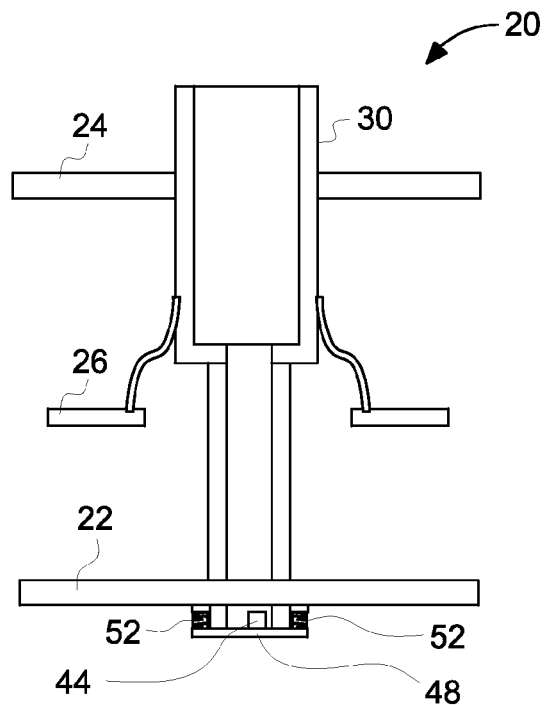
FIG. 10 is a cross-sectional view of the self-sealing coldhead sleeve of FIG. 9 in a closed position.

Modifications and variations are contemplated. For example, as illustrated in FIGS. 9 and 10, showing open and closed positions, respectively, the actuating member 44 is provided as part of the hatch 48. Accordingly, in operation, the actuating member 44 is configured as an engagement member that engages the bottom of the coldhead 28 as the coldhead 28 is inserted within the coldhead sleeve 30 to open the hatch 48.

It should be noted that the sealing member 42 may be configured and formed from different materials, such as a metal plate having a sealing rim (e.g., rubber rim). The sealing member 42 is generally sized and shaped in various embodiments to cover at least the entire open end 34. In some embodiments the sealing member 42 may be a swinging poppet valve or flapper valve having a corresponding seat (e.g., Teflon seat). In some of the various embodiments, the sealing member 42 is formed such that boil off of the helium from the helium vessel 22 is reduced or prevented.

Additionally, the actuating member 44 may be formed from a rigid (e.g., metal) or semi-rigid material. The spring joint 50 and/or springs 52 also may be configured to have a biasing force based on the pressure to which the sealing member 42 is subjected in the closed position. Thus, the biasing force of the spring joint 50 and/or springs 52 may be determined, for example, based on the particular system requirements.

Figure 11:
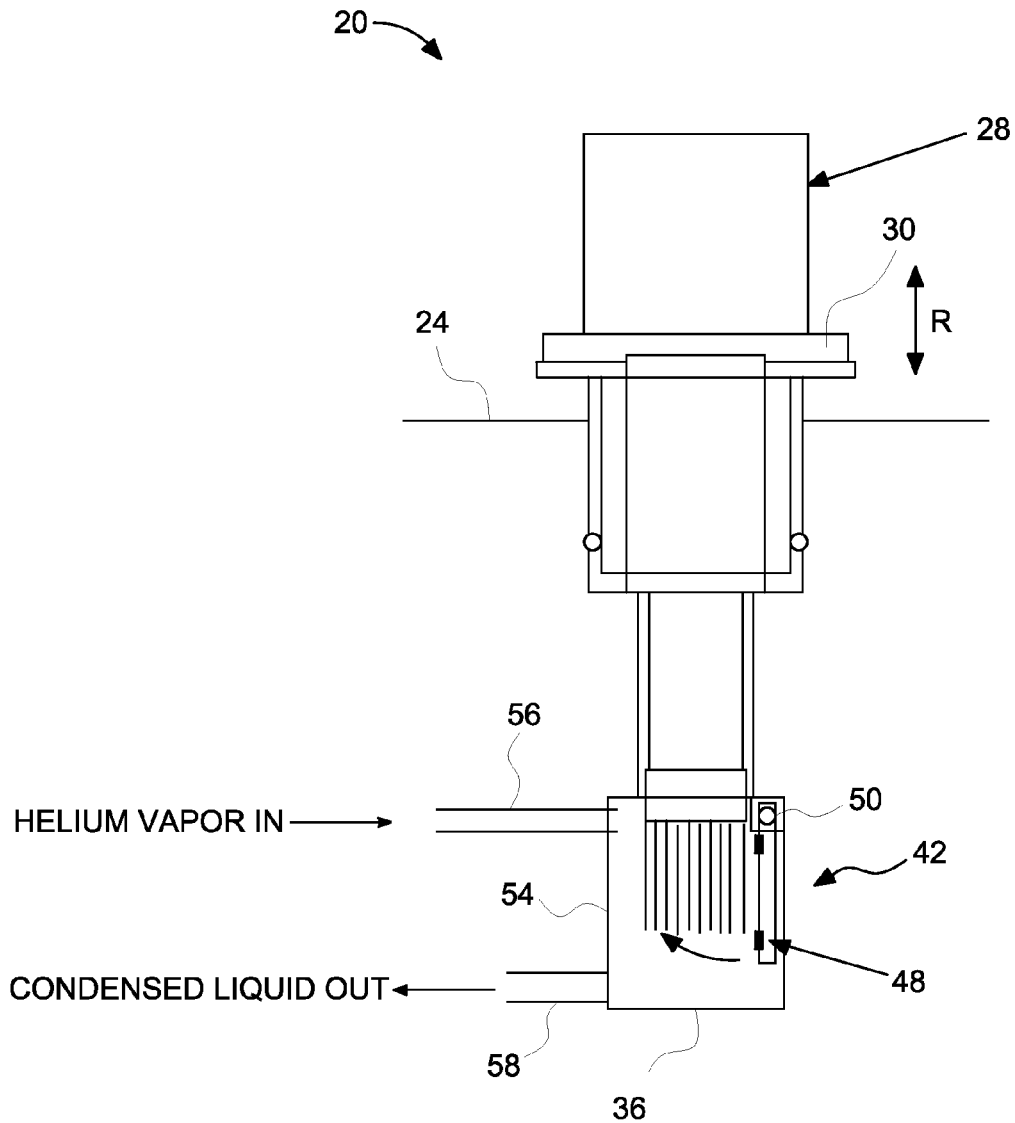
FIG. 11 is a diagram illustrating a self-sealing coldhead sleeve formed in accordance with another embodiment in an open position.

In still another embodiment, illustrated in FIG. 11, the sealing member 42 may form part of a valve arrangement 54 having an inlet 56 and an outlet 58 for receiving helium vapor from the helium vessel 22 and transferring condensed liquid back to the helium vessel 22, respectively. It should be noted that the sealing member 42 may also form part of the recondenser 36. In this embodiment, the coldhead sleeve 30 is configured as a moving radial sleeve that moves as illustrated by the arrow R. The sealing member 42 is configured as a hatch 48, and in particular, a pivoting flap. For example, the hatch 48 is connected at one end via the spring joint 50 to the coldhead sleeve 30 such that the hatch 48 pivots between the open and closed positions.

In operation, as the coldhead sleeve 30 moves or the coldhead 28 is inserted or removed from the coldhead sleeve 30, the sealing member 42 pivots. In this embodiment, the sealing member 42 operates as a swinging shutoff poppet or flapper valve, wherein, for example, a torsion spring biases the sealing member 42 to the closed position when the coldhead 28 is removed from the coldhead sleeve 30. The coldhead 28 engages the hatch 48 to open the hatch 48 as the coldhead 28 is inserted within the coldhead sleeve 30. Accordingly, the hatch 48 is moved to the open position as the coldhead 28 is inserted within the coldhead sleeve 30.

Thus, in accordance with various embodiments, a self-sealing or automatically closing coldhead sleeve is provided. The self-sealing or automatically closing coldhead sleeve arrangement seals the MRI system such that the helium vessel is automatically closed off from the atmosphere when the coldhead is removed from the coldhead sleeve.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

Thus, the various embodiments may be implemented in connection with different types of superconducting coils, such as superconducting coils for an MRI system. For example, the various embodiments may be implemented with superconducting coils for use with the MRI system 100 shown in FIG. 12. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a computed tomography (CT), positron emission tomography (PET), a single photon emission computed tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 12:
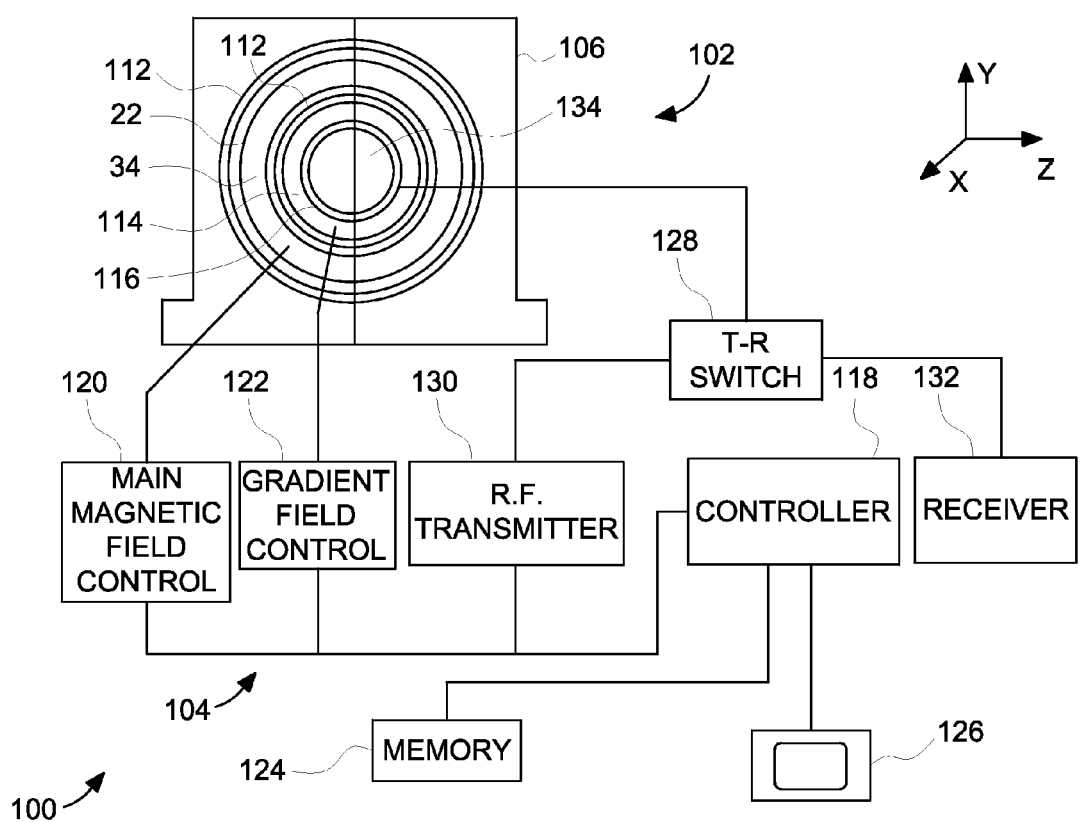
FIG. 12 is a pictorial view of an MRI system in which a self-sealing coldhead sleeve formed in accordance with various embodiments may be implemented.

Referring to FIG. 12, the MRI system 100 generally includes an imaging portion 102 and a processing portion 104 that may include a processor or other computing or controller device. The MRI system 100 includes within a gantry 106 a superconducting magnet 46 formed from coils, which may be supported on a magnet coil support structure. The helium vessel 22 (also referred to as a cryostat) surrounds the superconducting magnet 46 and is filled with liquid helium. The liquid helium may be used to cool a coldhead sleeve and/or a thermal shield as described in more detail herein.

Thermal insulation 112 is provided surrounding the outer surface of the helium vessel 22 and the inner surface of the superconducting magnet 46. A plurality of magnetic gradient coils 114 are provided inside the superconducting magnet 46 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet 46 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet 46 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet 46.

The magnetic gradient coils 114, which include one or more gradient coil elements, are provided so that a magnetic gradient can be imposed on the magnetic field $B_o$ in the bore 134 within the superconducting magnet 46 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A coldhead sleeve arrangement for a coldhead of a magnetic resonance imaging (MRI) system, the coldhead sleeve arrangement comprising:
   a coldhead sleeve configured to receive therein a coldhead of an MRI system and having an open end;
   a biasing member; and
   a sealing member coupled at the open end of the coldhead sleeve and configured biased by the biasing member in a normally closed position covering the open end, the sealing member opened when at least a portion of the coldhead is inserted into the open end of the coldhead sleeve.

2. The coldhead sleeve of claim 1, wherein the sealing member is pivotally coupled at the open end of the coldhead sleeve.

3. The coldhead sleeve of claim 2, further comprising a spring joint pivotally coupling the sealing member at the open end of the coldhead sleeve.

4. The coldhead sleeve of claim 1, wherein the sealing member is coupled at the open end of the coldhead sleeve in a linearly moving arrangement.

5. The coldhead sleeve of claim 1, wherein the sealing member comprises a moving hatch biased in the normally closed position.

6. The coldhead sleeve of claim 1, wherein the sealing member comprises one of a moving flapper valve or a moving poppet valve.

7. The coldhead sleeve of claim 1, further comprising an actuating member coupled to the coldhead sleeve and configured to engage the sealing member to move the sealing member to an open position when the coldhead is received within the coldhead sleeve.

8. The coldhead sleeve of claim 7, wherein the actuating member comprises a protrusion.

9. The coldhead sleeve of claim 1, further comprising an actuating member coupled to the sealing member and configured to engage the coldhead sleeve to move the sealing member to an open position when the coldhead is received within the coldhead sleeve.

10. The coldhead sleeve of claim 9, wherein the actuating member comprises a protrusion.

11. The coldhead sleeve of claim 1, further comprising a spring and wherein the sealing member is biased to the normally closed position by the spring.

12. A magnetic resonance imaging (MRI) magnet system comprising:
   a vessel having liquid helium therein;
   a superconducting magnet within the vessel;
   a coldhead;

a coldhead sleeve receiving therein the coldhead and having an open end; and a movable sealing member coupled at the open end of the coldhead sleeve and biased by a biasing member in a normally closed position covering the open end, the movable sealing member moved to an open position when the coldhead is inserted into the coldhead sleeve, the coldhead sleeve configured to apply a force to the movable sealing member to overcome a biasing force of the biasing member to move the movable sealing member to the open position.

13. The MRI magnet system of claim 12, wherein a portion of the coldhead is configured to extend through the open end to move the sealing member to an open position.

14. The MRI magnet system of claim 13, further comprising a protrusion on one of the coldhead or the movable sealing member to actuate movement of the movable sealing member.

15. The MRI magnet system of claim 12, wherein the movable sealing member is pivotally coupled at the open end.

16. The MRI magnet system of claim 12, wherein the movable sealing member is coupled at the open end in a linearly movable arrangement.

17. The MRI magnet system of claim 12, wherein the movable sealing member comprises one of a moving flapper valve or a moving poppet valve.

18. A method for forming a self-sealing coldhead sleeve for a magnetic resonance imaging (MRI) magnet system, the method comprising:

configuring a sealing member of a coldhead sleeve in a normally closed position using a biasing member; and coupling the sealing member to the coldhead sleeve at an open end of the coldhead sleeve such that the sealing member is (i) biased in the normally closed position when a coldhead is removed from the coldhead sleeve and (ii) moved to an open position when the coldhead is inserted within the coldhead sleeve with at least a portion of the coldhead extending through the open end.

19. The method of claim 18, wherein the coupling comprises one of pivotally coupling or coupling in a linearly moving arrangement the sealing member to the coldhead sleeve.

20. The method of claim 18, wherein the sealing member comprises one of a moving flapper valve or a moving poppet valve.

* * * * *